(12) United States Patent
Fischer

(10) Patent No.: US 7,244,311 B2
(45) Date of Patent: Jul. 17, 2007

(54) HEAT TRANSFER SYSTEM FOR IMPROVED SEMICONDUCTOR PROCESSING UNIFORMITY

(75) Inventor: Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/962,568

(22) Filed: Oct. 13, 2004

(65) Prior Publication Data

US 2006/0075969 A1   Apr. 13, 2006

(51) Int. Cl.
C23C 16/00 (2006.01)
C23F 1/00 (2006.01)
H01L 21/306 (2006.01)
B44C 1/22 (2006.01)
C03C 15/00 (2006.01)

(52) U.S. Cl. ............ 118/725; 156/345.52; 156/345.53; 216/67

(58) Field of Classification Search .......... 118/724, 118/725, 728; 156/345.51, 345.52, 345.53
See application file for complete search history.

(56) References Cited

U.S. PATENT DOCUMENTS

| | | | |
|---|---|---|---|
| 4,340,462 A | 7/1982 | Koch | |
| 4,579,618 A | 4/1986 | Celestino et al. | |
| 4,685,999 A | 8/1987 | Davis et al. | |
| 4,948,458 A | 8/1990 | Ogle | |
| 5,117,121 A | 5/1992 | Watanabe et al. | |
| 5,200,232 A | 4/1993 | Tappan et al. | |
| 5,262,029 A | 11/1993 | Erkine et al. | |
| 5,266,527 A | 11/1993 | Robbins | |
| 5,534,751 A | 7/1996 | Lenz et al. | |
| 5,569,356 A | 10/1996 | Lenz et al. | |
| 5,671,116 A | 9/1997 | Husain | |
| 5,740,016 A | 4/1998 | Dhindsa | |
| 5,796,066 A | 8/1998 | Guyot | |
| 5,880,922 A | 3/1999 | Husain | |
| 5,925,226 A | 7/1999 | Hurwitt et al. | |
| 5,998,932 A | 12/1999 | Lenz | |
| 6,039,836 A | 3/2000 | Dhindsa et al. | |
| 6,079,356 A | 6/2000 | Umotoy et al. | |
| 6,090,304 A | 7/2000 | Zhu et al. | |
| 6,125,025 A | 9/2000 | Howald et al. | |
| 6,140,612 A | 10/2000 | Husain | |
| 6,236,555 B1 | 5/2001 | Leeser | |

(Continued)

OTHER PUBLICATIONS

International Search Report and Written Opinion dated May 5, 2006 for PCT/US05/35751.

*Primary Examiner*—Parviz Hassanzadeh
*Assistant Examiner*—Rakesh Dhingra
(74) *Attorney, Agent, or Firm*—Buchanan Ingersoll & Rooney PC

(57) ABSTRACT

A plasma processing system and methods for processing a substrate using a heat transfer system are provided. The heat transfer system, which is capable of producing a high degree of processing uniformity across the surface of a substrate, comprises a uniformity pedestal supported on and in good thermal contact with a heat transfer member. The uniformity pedestal includes a pin array which provides a conformal substrate support surface (i.e., contact surface) that can conform to the profile of a backside surface of a substrate during processing. To uniformly cool a substrate, a large thermal gradient can be established between the uniformity pedestal and the heat transfer member during the processing of a substrate.

35 Claims, 6 Drawing Sheets

U.S. PATENT DOCUMENTS

| | | |
|---|---|---|
| 6,337,277 B1 | 1/2002 | Chou et al. |
| 6,344,105 B1 | 2/2002 | Daugherty et al. |
| 6,363,882 B1 | 4/2002 | Hao et al. |
| 6,389,677 B1 * | 5/2002 | Lenz .......................... 29/559 |
| 6,391,787 B1 | 5/2002 | Dhindsa et al. |
| 6,430,022 B2 | 8/2002 | Leeser |
| 6,431,115 B2 | 8/2002 | Komino et al. |
| 6,664,549 B2 | 12/2003 | Kobayashi et al. |
| 6,695,946 B2 | 2/2004 | Hsiao |
| 6,705,394 B1 * | 3/2004 | Moslehi et al. ............. 165/206 |
| 6,722,642 B1 * | 4/2004 | Sutton et al. ................ 269/21 |
| 6,739,208 B2 * | 5/2004 | Hyakudomi ............... 73/865.8 |
| 6,740,853 B1 * | 5/2004 | Johnson et al. .......... 219/444.1 |
| 6,895,179 B2 * | 5/2005 | Kanno et al. ............... 392/416 |
| 6,898,064 B1 * | 5/2005 | Berman et al. ............. 361/234 |
| 2001/0039917 A1 | 11/2001 | Arai et al. |
| 2005/0006028 A1 | 1/2005 | Keil et al. |
| 2005/0229854 A1 * | 10/2005 | Moroz ....................... 118/725 |

* cited by examiner

HEAT TRANSFER SYSTEM FOR IMPROVED SEMICONDUCTOR PROCESSING UNIFORMITY

BACKGROUND

Different chucking devices are widely used to hold semiconductor wafers or other substrates during processing. Mechanical chucks, for example, can secure a work-piece by using arms or clamps to press the work-piece against a supporting surface. However, the clamping force from a mechanical chuck is inherently non-uniform, resulting in uneven stresses in the work-piece that can cause deformation and uneven thermal contact between the work-piece and the support.

Vacuum chucks secure a work-piece by evacuating a void beneath the work-piece backside, thereby generating a clamping force due to the pressure differential between the processing chamber and the work-piece backside. Vacuum chucks can provide a more uniform clamping force than can mechanical chucks, but in the low pressure environments required for many semiconductor processing applications, the pressure differential is insufficient to generate an adequate clamping force.

Electrostatic chucks provide improved clamping uniformity in vacuum systems. An electrostatic chuck (ESC) uses an electrostatic potential to hold a work-piece in place during processing. By clamping the work-piece to the chuck, improved thermal conductivity between the work-piece and the chuck can be provided. Optionally, a high thermal conductivity gas such as helium may be disposed between the work-piece and the chuck in order to improve heat transfer between the work-piece and the chuck. Examples of mechanical clamps and ESC substrate holders are provided in commonly-owned U.S. Pat. Nos. 5,262,029; 5,880,922 and 5,671,116. As disclosed in U.S. Pat. No. 4,579,618, substrate holders in the form of an electrode can supply radiofrequency (RF) power into the chamber.

A difficulty that arises with the use of an ESC is removal of the residual electrostatic force between the work-piece and the chuck in order to remove the work-piece from the chuck. This residual force results from the accumulation of electric charge at the interface between the work-piece and the ESC support surface. Several techniques have been developed for removing or de-chucking a work-piece. For example, both the electrode and the work-piece can be grounded or, alternatively, the polarity of the chucking voltage applied to the electrode can be reversed in order to discharge the electrode. However, these techniques are not completely effective at removing all the charge on the electrode and the work-piece. A mechanical force is often required to overcome the residual attractive electrostatic force, which can damage the work-piece or create difficulty in retrieving the work-piece from an unintended position. Approaches for de-chucking work-pieces are disclosed in U.S. Pat. Nos. 5,117,121; 6,125,025; 6,236,555 and 6,430,022.

Processing apparatus that use resilient clamping members to engage a substrate with a substrate support surface are disclosed in U.S. Pat. Nos. 4,685,999; 5,266,527 and 5,925,226. Cryogenic cooling systems for processing semiconductor substrates are disclosed in U.S. Pat. Nos. 6,431,115 and 6,695,946.

Despite the developments to date, there is an interest in efficient, low cost apparatus for supporting wafers during processing. It would be an improvement to provide a substrate support that supported a substrate such as a semiconductor wafer while providing good process uniformity without introducing the difficulties associated with de-chucking.

SUMMARY

Provided is a heat transfer system adapted to support a substrate for semiconductor processing of an upper surface thereof comprising (i) a pin base overlying and in thermal contact with a heat transfer member, said pin base having an upper wall, a lower wall and a side wall extending between the upper and lower walls and defining a cavity therebetween, wherein said upper wall comprises an array of bores; (ii) an array of substrate support pins each of which is slideably positioned in a respective one of the bores, each substrate support pin in thermal contact with the pin base and comprising a contact tip at its upper distal end; and (iii) a pressurized gas source in fluid communication with said cavity and adapted to supply pressurized gas to said cavity in an amount sufficient to move each support pin in an upward direction.

Also provided is a plasma processing system for processing a surface of a substrate, comprising a vacuum processing chamber adapted to ignite and sustain a plasma for processing, and further comprising the above-described heat transfer system disposed within the processing chamber.

The pin array can comprise a dense array of support pins. For example, the support pins can be located no more than about 5 mm apart (i.e., the distance between the outer surface of nearest neighbor pins can be about 5 mm or less) and the diameter of the support pins can be between about 0.5 mm and 3 mm. Preferably, the pin array includes at least 1000 pins and each of the support pins comprises a cylindrical pin body adapted to slideably move within a respective one of the bores, the cylindrical pin body having a substantially constant outer diameter, each of the bores having a substantially constant inner diameter, wherein the outer diameter of the cylindrical pin body is between about 0.1 and 5% less than the inner diameter of the bore in which the cylindrical pin body is located.

The support pins and the pin base can be made from or coated with a metal or a semiconductor. In a preferred embodiment, the support pins and the pin base are coated with an electrically conductive and/or sputter resistant material that is resistant to plasma etching in a plasma reaction chamber.

The support pins and the pin base are adapted to transfer thermal energy from the substrate to the heat transfer member when the substrate is supported on the support pins. In order to improve the thermal contact between the pin base and the heat transfer member, the pin base can be bonded to the heat transfer member via solder, braze or an adhesive.

In an embodiment, the heat transfer system further comprises a temperature sensor adapted to measure a temperature at a backside surface of the substrate. The support pins can comprise at least one stop adapted to restrict their upward or downward movement.

In a preferred embodiment, the contact tips are configured to maximize the thermal contact between the substrate and the substrate support pins when the substrate is in physical contact with the support pins. Each contact tip, which can be substantially flat or substantially hemispherical, can comprise a contact surface having an average surface roughness of less than about 0.3 microns.

Under the weight of the substrate, each of the support pins is adapted to be displaced downwardly by contact with a backside surface of the substrate. Without the substrate on the support pins, each of the support pins is adapted to be displaced upwardly by a positive gas pressure in the cavity.

The heat transfer member can comprise flow channels in fluid communication with a thermal fluid source that is adapted to circulate a thermal fluid in the flow channels. Preferred thermal fluids include water (e.g., deionized water), liquid helium, liquid nitrogen, ethylene glycol, propylene glycol and/or Fluorinet™.

In addition to or in lieu of a thermal fluid, the heat transfer system can comprise a plurality of thermoelectric elements (e.g., a concentric arrangement of thermoelectric elements) on top of the heat transfer member. Thus, heat transfer fluid and/or the thermoelectric elements can be used to provide heat to or remove heat from a substrate that is supported by the support pin array. In embodiments where a bottom RF electrode is provided, the thermoelectric elements are preferably located below the bottom RF electrode.

Preferably, the heat transfer system further comprises a gas supply inlet in the pin base for flowing a pressurized gas into the cavity and optionally a gas outlet for releasing a pressured gas from the cavity. The pressurized gas can be helium, nitrogen or argon. The gas supply to the cavity can include a mass flow controller to adjust the gas pressure in the cavity.

In a preferred embodiment, the heat transfer system further comprises an RF electrode configured for generating a plasma in the chamber or applying an RF bias to the substrate. When the heat transfer system comprises an RF electrode, preferably a bottom surface of the pin base is bonded to an upper surface of the RF electrode and a bottom surface of the RF electrode is bonded to an upper surface of the heat transfer member. Solder, braze, or an adhesive can be used to bond the RF electrode to the pin base and/or heat transfer member. Preferably the RF electrode, if provided, is in thermal contact with both the overlying pin base and the underlying heat transfer member. If desired, the RF electrode can be separated from the heat transfer member by a layer of dielectric material such as quartz, alumina or the like. The RF electrode can be supplied RF power at a single frequency or at multiple frequencies by providing suitable RF matching circuitry.

In a further embodiment, the heat transfer system can comprises an edge ring disposed above the RF electrode. The edge ring is configured for shielding the RF electrode and the pin base from plasma used to process the substrate. A preferred edge ring has a first portion configured to be disposed between the RF electrode and the substrate when the substrate is supported by the heat transfer system. Furthermore, the heat transfer system can comprise an impedance matching layer disposed between the RF electrode and the edge ring, wherein the impedance matching layer is bonded to the RF electrode and/or to the edge ring. Preferably, the impedance matching layer is configured to control an impedance between the RF electrode and a processing plasma in order to improve processing uniformity across the upper surface of the substrate.

The substrate can be a semiconductor wafer. An RF electrode, if provided, can have a diameter less than, greater than or equal to the diameter of the wafer, but preferably not more than about 2 mm less than or more than about 2 mm greater than the diameter of the wafer.

In a method of processing a substrate in a process chamber comprising the heat transfer system, the substrate is supported on the support pin array, which can cause one or more support pins to be moved downwardly due to the force of the weight of the substrate (e.g., the gas pressure urging the pins upwardly can be set to cause all of the pins to drop under the weight of the substrate and conform to the backside surface of the substrate). The gas pressure in the cavity is controlled in accordance with the weight of the substrate such that the pressure is sufficient to force the support pins upwardly such that the contact tips of a majority or all of the support pins are in contact with a backside surface of the substrate during processing (e.g., plasma processing) thereof.

In a preferred method, the process chamber is a plasma etch chamber and the processing comprises generating a plasma adjacent the upper surface of the substrate and etching an exposed layer on the upper surface of the substrate with the plasma. Alternatively, the processing can comprise forming a layer on the upper surface of the substrate (e.g., by chemical vapor deposition, thermal oxidation, sputtering or other deposition processes). Still yet, the processing can comprise stripping photoresist or other material from the substrate.

During processing of a substrate, preferably the gas pressure in the cavity is maintained at a level effective to maintain at least 95% of the contact tips in thermal contact with a backside surface of the substrate.

By circulating a thermal fluid in the heat transfer member the heat transfer member can be cooled to a temperature of less than about 100K during processing. By circulating a thermal fluid in the heat transfer member and/or by supplying currents to a plurality of thermoelectric modules in heat transfer contact with the substrate support pins, a substrate can be cooled to a temperature of less than about 450K during processing. A large temperature gradient (e.g., at least about 200K, more preferably at least about 300K) is preferably maintained between the heat transfer member and the substrate in order to uniformly cool the substrate during processing.

Processing of a substrate can comprise chemical vapor deposition, plasma vapor deposition, physical vapor deposition, sputtering, ion implantation, plasma etching or resist stripping. In using the pin base, a substrate can be supported and processed without mechanically or electrostatically clamping the substrate.

BRIEF DESCRIPTION OF THE DRAWING FIGURES

DETAILED DESCRIPTION OF PREFERRED EMBODIMENTS

Figure 1:
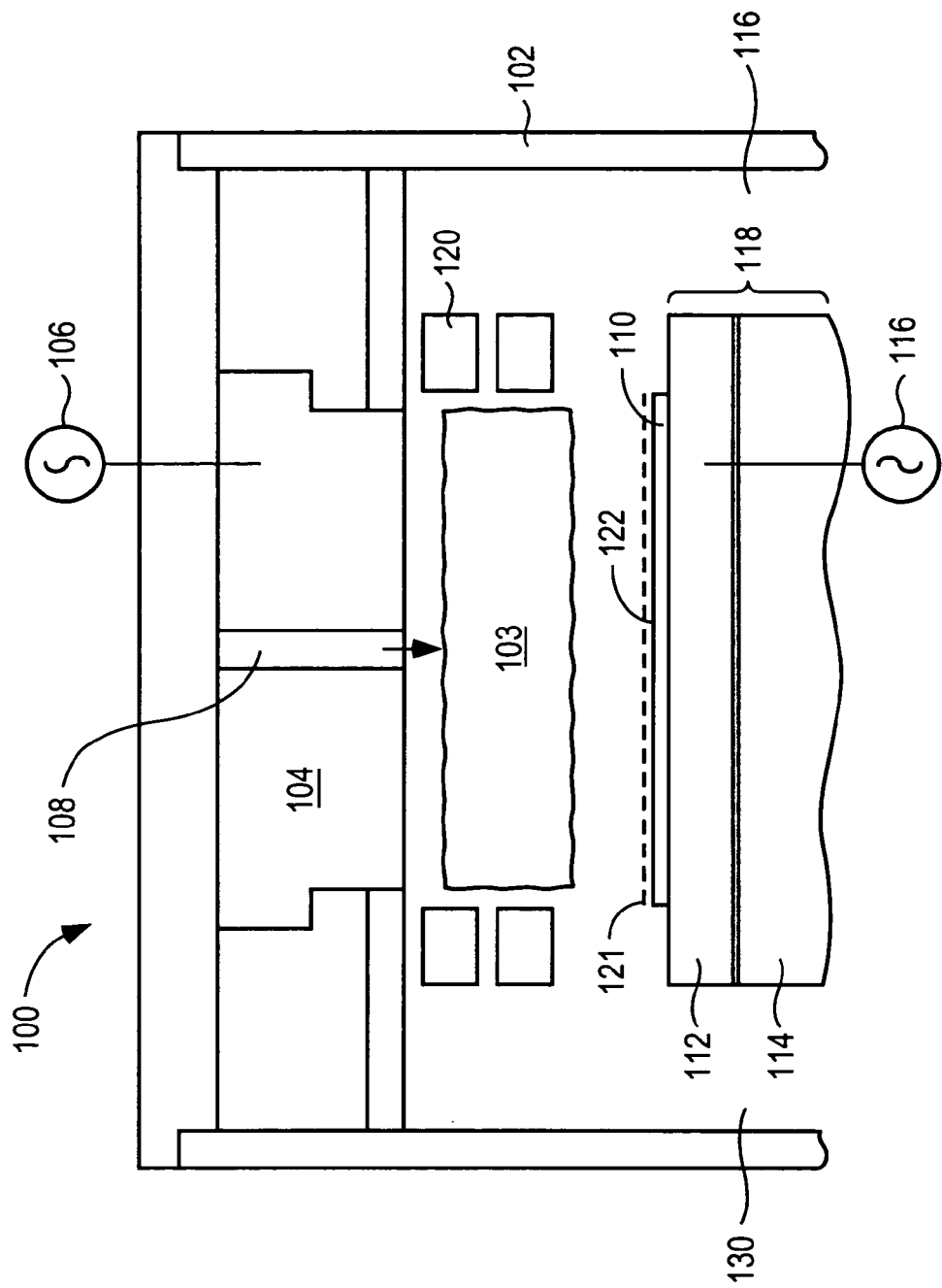
FIG. 1 is a side elevation view, in cross section, of a plasma reactor, in accordance with one embodiment.

Provided are improved semiconductor processing apparatuses and methods for processing substrates and improving process uniformity. Preferably the process is a plasma etch process used in semiconductor device fabrication. More particularly, provided is a heat transfer system that is capable of producing a high degree of processing uniformity across the surface of a substrate. The substrate can comprise a semiconductor substrate used to manufacture integrated circuits or a glass substrate used to manufacture a flat panel display. The heat transfer system comprises a substrate pedestal (uniformity pedestal) supported on and in good thermal contact with a heat transfer member. The uniformity pedestal is adapted to provide a conformal substrate support surface (i.e., contact surface) that conforms to the profile of the backside surface of a substrate during processing thereby providing good thermal transfer properties between the substrate and the heat transfer member.

The conformal support surface is formed by an array of movable support pins that are slideably mounted within the uniformity pedestal. In operation, each pin can be forced into a fully extended position by a positive backside gas pressure, but can be displaced from the extended position under the weight of and by contact with the backside surface of a substrate. In preferred embodiments a large thermal gradient is established between the uniformity pedestal and the heat transfer member during processing of the substrate in order to generate a large driving force to cool the substrate.

The heat transfer system is configured to reduce the thermal and electrical discontinuities across the surface of a substrate without using an electrostatic clamping element and without using backside cooling (e.g., helium gas backside cooling). By reducing these discontinuities, process variations found between the center and edge of the substrate are substantially reduced. As a result, more of the substrate can be used for creating integrated circuits (IC's) and therefore device yield can be increased. As used herein, "process uniformity" refers to the uniformity of the entire process across the surface of the substrate. If the process is highly uniform, for example, it is expected that the process rates at different points on the substrate tend to be substantially equal.

Generally, during semiconductor processing (e.g., plasma processing such as plasma etching, plasma-assisted deposition, resist stripping, etc.) a substrate is provided on a substrate support within a processing chamber. Thermal energy can be transferred to the substrate through ion bombardment and the substrate support preferably removes heat from the substrate while maintaining both a stable and uniform plasma in the chamber and a stable and uniform temperature at the substrate surface. In particular, in many types of plasma processes, the substrate (e.g., wafer) temperature can be significantly higher than the support temperature such that control of thermal conductance across the substrate/support interface is desired in order to control substrate temperature uniformity.

To ensure uniform processing over the entire area of the exposed substrate surface, a substantially uniform wafer temperature is desirable at the substrate surface. In the case of plasma etching, for example, the etch rate, etch rate selectivity, and anisotropy of etch can all be affected by the temperature of the substrate during plasma etching. Likewise, the temperature of the substrate can affect the rate of film deposition as well as the physical, electrical, and optical properties of the deposited material during a film deposition process.

Preferred embodiments are practiced in conjunction with a plasma reactor, such as a capacitively coupled plasma reactor, e.g., an Exelan™ plasma etcher, which is available from Lam Research Corporation of Fremont, Calif. Although a capacitively coupled plasma reactor will be shown and described, it should be noted that the heat transfer system can be used in conjunction with any semiconductor processing apparatus, e.g., an apparatus that is suitable for forming a plasma, including a high density plasma reactor such as an inductively coupled or an electron-cyclotron resonance (ECR) reactor. The heat transfer system can be used in a non-plasma apparatus to produce a uniform substrate temperature, e.g., a chemical vapor deposition apparatus or an ion implantation apparatus.

The plasma reactor can comprise a dual frequency capacitively coupled plasma reactor including an upper showerhead electrode and a bottom electrode, RF energy being supplied at two different frequencies (e.g., 27 MHz and 2 MHz) to either the bottom electrode or at different first and second frequencies to the showerhead electrode and/or the bottom electrode. See, for example, commonly-owned U.S. Pat. No. 6,391,787, the disclosure of which is hereby incorporated by reference in its entirety. In the case where the plasma reactor is a capacitively coupled plasma etch reactor, the reactor can have a powered showerhead electrode and a powered bottom electrode, the showerhead electrode preferably being supplied about 500 to 3000 Watts of RF energy and the bottom electrode preferably being supplied about 500 to 3000 Watts of RF energy.

FIG. 1 illustrates a plasma reactor 100 in accordance with one embodiment. The plasma reactor 100 generally includes a process chamber 102 within which a plasma 103 can be ignited and sustained for processing. Inside the chamber 102 there is generally disposed an upper electrode 104, which may be coupled to a first RF power supply 106 via a matching network (not shown). First RF power supply 106 is generally configured to supply upper electrode 104 with RF energy. A gas inlet 108 is provided within the upper electrode 104 for introducing process gas, e.g., etchant gases, into an active region between the upper electrode 104 and a substrate 110. The process gas may also be introduced into chamber 102 by various types of gas supply arrangements such as a gas injector, gas distribution plate (e.g., showerhead), one or more gas rings and/or other suitable arrangement. In the illustrated embodiment, the process chamber 102 is arranged to be substantially cylindrical in shape, and the chamber walls are arranged to be substantially vertical. It should be understood, however, that various configurations of the process chamber and internal components, including the chamber walls, may be used.

Substrate 110 can be introduced into chamber 102 and disposed on uniformity pedestal 112, which acts as a substrate support and optionally, in a preferred embodiment, comprises a lower electrode. Uniformity pedestal 112 comprises an upper portion of heat transfer system 118. Heat transfer member 114 comprises a lower portion of heat transfer system 118. Preferably the uniformity pedestal is in good thermal contact with the heat transfer member. A layer of adhesive such as an adhesive can be used to bond the uniformity pedestal 112 to the heat transfer member 114. The uniformity pedestal can also be attached to the heat transfer member using other joining techniques such as soldering or brazing. Heat transfer system 118, including heat transfer member 114 and uniformity pedestal 112 will be described in greater detail below.

Substrate 110 represents the work-piece to be processed, which may be, for example, a semiconductor wafer. In addition to a semiconductor wafer, the substrate can comprise a glass panel to be processed into a flat panel display. The substrate 110 can comprise one or more layers to be removed (etched) during processing or, alternatively, the processing can comprise forming one or more layers on the substrate.

An exhaust port 130 is preferably disposed between the walls of the chamber 102 and the heat transfer system 118.

The exhaust port 130 is configured for exhausting gases formed during processing, and is generally coupled to a turbomolecular pump (not shown), located outside of the process chamber 102. In most embodiments, the turbomolecular pump is arranged to maintain the appropriate pressure inside the process chamber 102. Although the exhaust port is shown disposed between the chamber walls and the uniformity pedestal, the actual placement of the exhaust port may vary according to the specific design of the plasma processing system. For example, gases may also be exhausted from ports built into the walls of the process chamber. In addition, a plasma confinement ring assembly 120 may be disposed inside process chamber 102 between the upper electrode 104 and the uniformity pedestal 112 to confine the plasma 103 above the substrate 110. See, for example, commonly-owned U.S. Pat. Nos. 5,534,751; 5,569,356 and 5,998,932, the contents of which are hereby incorporated by reference in their entirety.

An optional lower electrode can be incorporated in uniformity pedestal 112 in which case the upper electrode can be a non-powered electrode (e.g., grounded electrode) or powered using the same or a different RF frequency than the lower electrode. If the upper electrode and the lower electrode are powered, suitable filter arrangements can be used to provide return paths for the current frequencies supplied to the powered electrodes. The lower electrode is preferably powered by a second RF power supply 116 (also typically via a matching network) that is generally configured to supply the lower electrode with RF energy. In various plasma processes a lower electrode can be used to supply RF power to produce a plasma in the open space above the substrate and/or apply an RF bias to the substrate. The amount of energy that is coupled between the upper and/or lower electrode and the plasma generally affects the density and energy of the plasma used to process the substrate. For example, if the coupled energy is large, the ion energy tends to be high. If the coupled energy is small, the ion energy tends to be low. Correspondingly, high ion energy tends to be more aggressive during substrate processing and a low ion energy tends to be less aggressive during substrate processing. The energy generated by the bottom electrode may also be arranged to form a sheath voltage 121 proximate the substrate surface 122, which is used to accelerate the ions in the plasma 103 towards the substrate 110 where they can activate the processing reaction.

Preferably, the outer periphery of the lower electrode is configured to extend beyond at least the outer edge of the substrate. One particular advantage of extending the electrode past the substrate edge is that the electrical characteristics at the edge of the substrate tend to be more uniform. That is, the coupling of RF energy tends to be more uniform near the edge of the substrate, and as a result, processing tends to be more uniform across the surface of the substrate. For example, the lower electrode can be configured to couple energy about 2 mm beyond the periphery of the substrate. Radio frequency (RF) power can be applied to a central region of the lower RF electrode using a single connection to improve the distribution of RF energy across the electrode surface.

The upper electrode and, if provided, the lower electrode are preferably substantially uniform, good RF conductors and can be substantially planar with respect to the substrate 110. The upper electrode can be a planar electrode or a non-planar, stepped upper electrode as disclosed in commonly-owned U.S. Pat. No. 6,391,787. The upper electrode can be a domed-shaped electrode. In a preferred embodiment each RF electrode is a continuous unbroken layer of a highly conductive material. The RF electrodes can be made from any suitable electrically conductive material. For example, the RF electrodes can comprise silicon (e.g., doped silicon), carbon (e.g., graphite), silicon carbide, aluminum and the like. The upper electrode can comprise a powered or grounded showerhead electrode. Preferably, the RF electrodes are thick enough to withstand the radio frequency (RF) power applied to them. A preferred thickness of an RF electrode ranges from about 0.1 cm to about 2 cm, though thicker electrodes may be provided. Optionally, the upper electrode can be provided with a backing plate or retaining ring. For example, a silicon upper electrode can be provided with a graphite backing plate.

While the uniformity pedestal is shown and described as being coupled to RF power supply 116, it will be appreciated that other configurations may be used to accommodate different process chambers or to conform to other external factors necessary to allow the coupling of energy. For example, in some single frequency plasma reactors power can be supplied to an upper electrode and the uniformity pedestal may be coupled to ground.

In order to generate plasma 103, a process gas is typically supplied into process chamber 102 through gas inlet 108. Subsequently, when one or both of the RF power supplies are energized, an electric field is capacitively coupled inside the process chamber through one or both of the RF electrodes.

It should be noted that although the plasma reactor 100 is described in detail, the heat transfer system itself is not limited to any particular type of substrate processing apparatus and may be adapted for use in any of the known substrate processing systems, including but not limited to those adapted for etching processes, including those adapted for dry etching, plasma etching, reactive ion etching (RIE), magnetically enhanced reactive ion etching (MERIE), electron cyclotron resonance (ECR) or the like. A plasma processing reactor can comprise a parallel plate etch reactor such as the dual frequency plasma etch reactor described in commonly-owned U.S. Pat. No. 6,090,304, the disclosure of which is hereby incorporated by reference. Furthermore, the heat transfer system may be used in any of a number of deposition processes, including those adapted for chemical vapor deposition (CVD), plasma enhanced chemical vapor deposition (PECVD), and physical vapor deposition (PVD) such as sputtering. The heat transfer system may be used in an ion implantation apparatus.

Further still, it is contemplated that the heat transfer system may be practiced in any of the above reactors, as well as other suitable plasma processing reactors irrespective of whether energy to the plasma is delivered through direct current plasma sources, capacitively coupled parallel electrode plates, ECR microwave plasma sources, or inductively coupled RF sources such as helicon, helical resonators, and RF antennas (planar or non-planar). Suitable plasma generating equipment is disclosed in commonly-owned U.S. Pat. No. 4,340,462 (parallel plate); U.S. Pat. No. 5,200,232 (ECR); and U.S. Pat. No. 4,948,458 (inductively coupled), the contents of which are incorporated herein by reference in their entirety.

During plasma processing, the bombarding ions of the plasma tend to increase the temperature of the substrate and the adjacent surfaces such as focus rings and/or other parts surrounding the substrate. In the absence of sufficient cooling, the temperature of the substrate may rise to a temperature sufficient to cause thermal damage to devices and/or materials incorporated therein. Generally, for an unclamped substrate the thermal contact between the wafer and the wafer support surface is insufficient to dissipate the heat produced in the substrate during plasma processing.

For a substrate supported by the heat transfer system, the temperature of the substrate during plasma processing is primarily a function of: 1) the ion flux and ion energy incident on the surface of the substrate; 2) the temperature gradient between the heat transfer member and the substrate; and 3) the thermal transfer coefficient of heat from the bottom surface of the substrate to the heat transfer member.

A heat transfer system is provided to control the temperature and temperature uniformity of the substrate during processing. The heat transfer system comprises a uniformity pedestal having a conformal substrate support surface in thermal contact with a heat transfer member. The conformal support surface can provide good thermal contact between the substrate and the heat transfer member without using an electrostatic clamping element. The conformal contact surface can conform to the topography of the backside of the wafer.

In preferred embodiments, the heat transfer system provides a large temperature difference, $\Delta T$, between the support surface of the uniformity pedestal and the heat transfer member. Preferably $\Delta T$ is at least about 200K or at least about 300K. In general, thermal heat transfer, H, between the substrate and the substrate support surface can be expressed as H~k $\Delta T$, where k is the heat transfer coefficient. Thus, thermal heat transfer can be increased by increasing the heat transfer coefficient and/or by increasing the temperature gradient between the substrate and the underlying substrate support.

Figure 2:
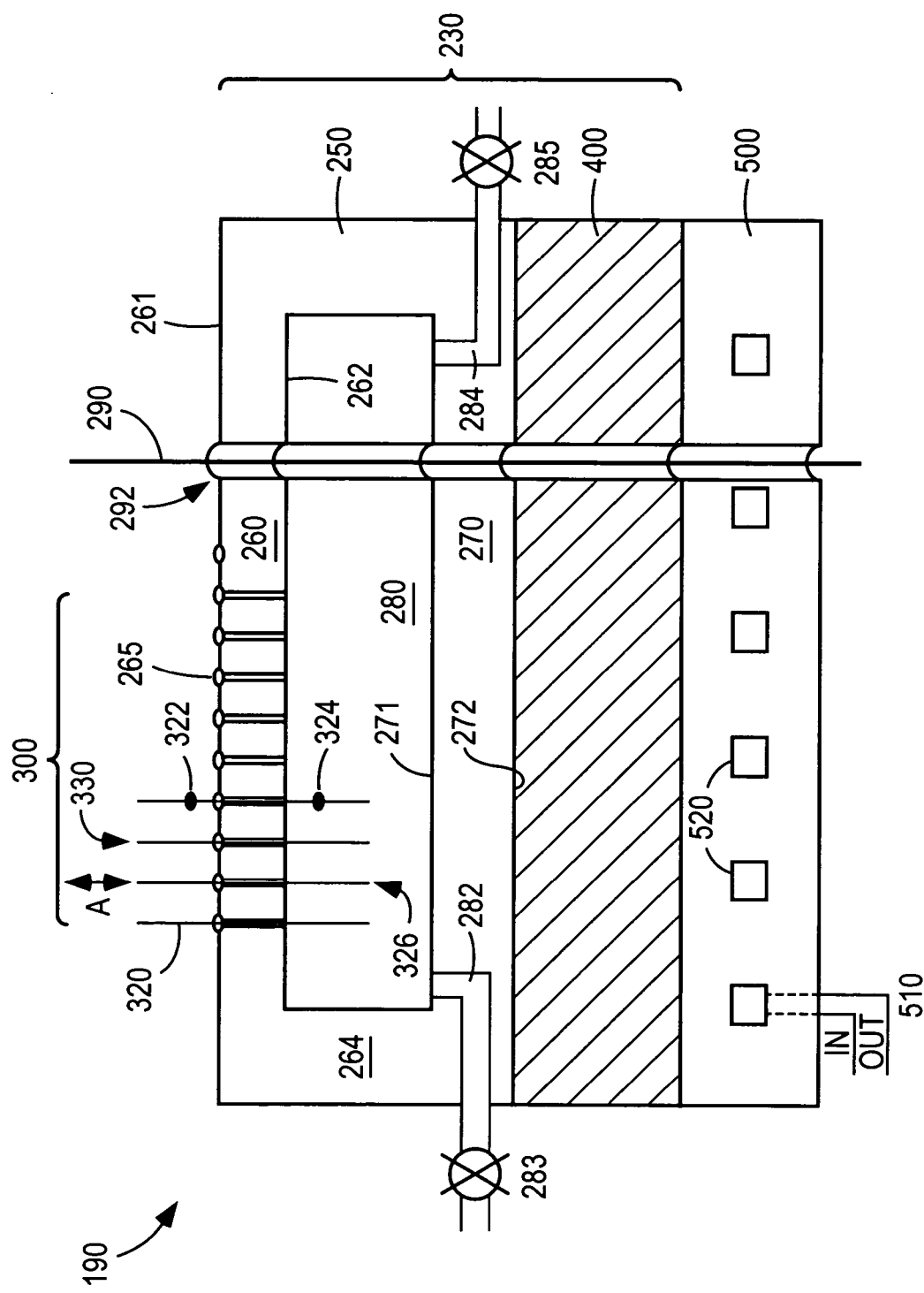
FIG. 2 is a side elevation view, in cross section, of a heat transfer system, in accordance with one embodiment.

In one embodiment the heat transfer system is configured to produce a uniform substrate temperature. The geometry of a preferred heat transfer system is depicted in greater detail in FIGS. 2–6. It is to be understood that the depictions in FIGS. 2–6, which are not to scale, are intended to provide enhanced clarity in the discussion of the operation of the heat transfer system. FIG. 2 illustrates a cross-sectional view of heat transfer system 190 comprising uniformity pedestal 230 and heat transfer member 500.

The heat transfer member 500 generally includes a main input and output channels 510 for distributing a thermal fluid such as water, liquid helium, liquid nitrogen, ethylene glycol, propylene glycol or mixtures thereof to a plurality of inner flow channels 520. For example, a closed loop helium refrigerator can be used. Other coolants include Fluorinet™, which is available from 3M. Inner flow channels 520 can comprise a single zone (e.g., spiral) flow channel, or the inner flow channels 520 can comprise two or more separately supplied channels having their respective input and output channels (not shown).

Thermal fluid flows from a thermal fluid source (not shown) into the heat transfer member and then flows out of the heat transfer member back to the thermal fluid source. Generally, the thermal fluid source includes a heat exchanger wherein the thermal fluid is cooled or heated before being circulated into the heat transfer member. To cool the substrate and/or the uniformity pedestal, the heat generated in the substrate and the uniformity pedestal by the process can transfer into the thermal fluid, which is circulated in the heat transfer member and transferred out of the process chamber. Alternatively, to heat the substrate and/or the uniformity pedestal, the thermal fluid can be heated to transfer heat into the uniformity pedestal and the substrate.

In another embodiment, the temperature of the uniformity pedestal and hence the temperature of the substrate support pins can be controlled using an array of thermoelectric Peltier devices. Preferably the uniformity pedestal is cooled, though both heating and cooling can be provided using at least one Peltier device that optionally are in thermal contact with a closed fluid loop within the heat transfer member. For example, an array of thermoelectric Peltier devices may be positioned above the heat transfer member 500 for enhancing the conduction of heat from the uniformity pedestal to the thermal fluid or vice versa. A temperature controlled substrate having a plurality of thermoelectric modules is described in commonly-owned U.S. Pat. No. 5,740,016, the disclosure of which is hereby incorporated by reference in its entirety.

When thermoelectric devices are used to cool the uniformity pedestal, an electrical current is provided to the thermoelectric devices to create a cold side toward the uniformity pedestal and a hot side toward the heat transfer member 500. Optionally, a cooled thermal fluid can flow from the thermal fluid source into the heat transfer member 500 to cool the hot side of thermoelectric devices. As the thermal fluid cools the hot side of the thermoelectric devices, the cold side of the thermoelectric devices cools the uniformity pedestal. In this manner, the thermoelectric devices can enhance the conduction of heat from the uniformity pedestal.

When the thermoelectric devices are used to heat the uniformity pedestal, an electrical current is provided to the thermoelectric devices to create a hot side toward the uniformity pedestal and a cold side toward the heat transfer member 500. Optionally, a heated thermal fluid can flow from the thermal fluid source into the heat transfer member 500 to heat the cold side of thermoelectric devices. As the thermal fluid heats the cold side of the thermoelectric devices, the hot side of the thermoelectric devices heats the uniformity pedestal. The heat flux from the substrate to (or from) the heat transfer member can be controlled by controlling the electric current supplied to the thermoelectric device(s).

According to a preferred embodiment, heat transfer member 500 is used to cool the pedestal 230 such that a large temperature difference between the substrate and the heat transfer member is provided. A heat transfer member using either liquid nitrogen in combination with one or more Peltier elements or a closed-loop helium bath can produce a temperature gradient of up to about 194K or about 298K, respectively.

The uniformity pedestal 230, which comprises optional bottom electrode 400, may correspond to the uniformity pedestal 112 illustrated in FIG. 1. The uniformity pedestal 230 includes a hollow pin base 250. Pin base 250 comprises upper wall 260, side wall 264 and lower wall 270. Upper wall and lower wall have upper surfaces 261, 271 and lower surfaces 262, 272, respectively. Upper wall 260, side wall 264 and lower wall 270 define cavity 280. In operation, feed-throughs (e.g., a lift-pin arrangement for raising and lowering a substrate onto and off of the uniformity pedestal) can be located in the cavity volume.

Pin base 250 is adapted to support an array of substrate support pins 320. An array of bores extends transversely across the upper wall and pass through the upper wall from upper surface 261 to lower surface 262. Each bore is dimensioned to accommodate a substrate support pin 320. Each substrate support pin 320 is adapted to slideably fit within a bore. Preferably the bores are arranged in a dense array (e.g., a close-packed pattern, a pattern of concentric circles, a square array, etc.). For example, the bores can be arranged in a dense array such that the distance between adjacent (i.e., nearest neighbor) bores is less than 5 mm, preferably about 3 mm. Thus, the substrate support pins 320 are arranged in the same pattern as that of the bores. Collectively, support pins 320 form a pin array 300 that is smaller than, equal to, or larger than the surface area of the lower surface of the substrate.

To process a substrate, a processing chamber such as a plasma reactor is provided with the heat transfer system 190 therein. The substrate is loaded into the chamber, and placed on the support pin array inside the chamber. For example, a robot arm (not shown) can transport a substrate from a load-lock transfer chamber into the process chamber. A lift pin assembly (not shown) has lift pins that can be raised and lowered through the pin base by a lift mechanism. Preferably the lift pins, which pass through pin base 250, lower electrode 400 and heat transfer member 500, are not in fluid communication with cavity 280 and are electrically and thermally insulated from the lower electrode and heat transfer member. The robot arm can place the substrate on the tips of the lift pins and the lift mechanism can lower the substrate onto the pin array. As described in more detail below, after the substrate is placed on the pin array, the gas pressure in cavity 280 is such that a majority or all of the support pins are in contact with the backside surface of the substrate. For example, the substrate can be placed on fully extended support pins and the gas pressure can be preset to allow the support pins to lower under the weight of the substrate, or the substrate can be placed on fully retracted support pins and the gas pressure can be increased to raise the support pins. After processing the substrate, the lift mechanism can raise the lift pins to lift the substrate off the uniformity pedestal, allowing the substrate to be removed from the processing chamber via the robotic arm.

During processing, a substrate is positioned on the pin array such that a majority of the support pins make physical contact with the backside surface of the substrate. Thus, during processing heat can be transferred from the substrate to the heat transfer member via the array 300. The temperature distribution across the substrate surface can be determined by the geometric arrangement (e.g., pattern, pattern density) of the support pins as well as by the materials properties (e.g., thermal conductivity) of the support pins themselves. The pin array can comprise a uniform or a non-uniform pattern of support pins.

The heat transfer system can be configured to comprise two or more zones, which can provide the same heat flow or a different heat flow to different regions of a supported substrate. For example, the heat transfer member may comprise a first zone for cooling (or heating) the inner portion of the uniformity pedestal, and a second zone for cooling (or heating) the outer portion of the uniformity pedestal. During processing of a substrate, the same temperature or different temperatures may be set for each of the plurality of two or more zones. Preferably each zone of a multi-zone heat transfer member is thermally isolated from other zones such that the temperature of each zone can be independently controlled. Thus, a multi-zone heat transfer member can be used to uniformly cool (or heat) the uniformity pedestal to a desired temperature and/or compensate for non-uniform heat distribution across the uniformity pedestal during processing. In embodiments where a multi-zone heat transfer member is provided, preferably a multi-zone pin base is provided.

A separate pin base can be mounted over each zone of a multi-zone heat transfer member. Thus, the heat transfer system can comprise a multi-zone pin base with each pin base being supported on a separate heat transfer member. Preferably, each zone of a multi-zone pin base is thermally isolated from other pin base zones such that the temperature of each zone can be independently controlled by controlling the temperature of the underlying heat transfer member.

Each zone of a multi-zone heat transfer system is preferably thermally isolated from other zones. A dielectric material such as glass, quartz or alumina can be used to thermally isolate each zone.

The heat transfer system supporting the substrate undergoing etching preferably cools the substrate sufficiently to prevent burning of any photoresist on the substrate. Preferably the average substrate temperature during plasma etching is maintained less than 140° C. In high-density plasma reactors, it is generally sufficient to cool the substrate to a temperature of between about −20 to 40° C. In order to maintain the substrate at a desired temperature, the heat transfer member can be cooled to a temperature of less than about 100K (e.g., 77K or lower).

The pin base further comprises gas supply inlet 282 for flowing pressurized gas into cavity 280. Optionally, pin base can comprise gas outlet 284 for releasing pressurized gas from the cavity. The gas flow rate through the inlet 282 and outlet 284 can be controlled by pressure control valves 283, 285 such that the net gas flow into cavity 280 determines the pressure of gas inside the cavity. A manometer can be connected to gas supply inlet 282 to measure the gas pressure in cavity 280. The manometer can output a signal corresponding to the measured pressure to a mass flow pressure controller and readout (not shown). The pressure controller is electrically connected to, and controls pressure control valves 283, 285 in response to the pressure measured. Pressure control valves 283, 285 are in fluid communication with a gas source, such as helium, nitrogen, argon or mixtures thereof.

In a preferred embodiment, when a substrate is placed on uniformity pedestal 230, the weight of the substrate exerts a downward force on the array of support pins 320. Each pin is capable of being downwardly displaced by contact with the backside surface of the substrate. The pressure of the gas in cavity 280 can exert an upward force on support pins 320. During processing, the gas pressure in cavity 280 continuously exerts an upward force on each support pin. By supplying an effective amount of gas pressure in cavity 280, the upward force exerted by the pressurized gas on the support pins can cause at least a majority of the support pins to engage the backside surface of the substrate. Preferably, greater than 95% (e.g., 100%) of the support pins make thermal contact with the backside of the substrate during processing.

Thus, the array 300 of independently moveable support pins 320 can provide a conformal support surface that can make thermal contact with a planar or non-planar substrate. The conformal support surface provides thermal contact between the backside of the substrate and the heat transfer member without electrostatically clamping the substrate to the support surface.

Preferably, one or more temperature sensors (e.g., thermocouples, fiber optic sensors, etc.) are disposed on or adjacent the top surface of the uniformity pedestal 230 to provide a real-time indication of the temperature of the substrate during processing. For example, one or more support pins can be omitted and a temperature sensor such as a thermocouple or blackbody probe can be provided in place of the support pin. Details of a blackbody probe suitable for sensing a temperature of a supported wafer can be found in common-assigned U.S. Pat. No. 6,140,612, the content of which is hereby incorporated by reference in its entirety. Alternatively, or additionally, one or more temperature sensors can be disposed in the heat transfer member to sense the temperature of the heat transfer member and/or the thermal fluid.

Both the area of direct contact between the backside of the substrate and support pins 320 and the efficiency of the thermal conductivity across the substrate/support pin interface affect the amount of heat transferred. The area of direct contact between the support pins and the substrate, which is a function of the number and number density of support pins as well as the roughness, flatness and hardness of a support pin contact surface, can affect the substrate temperature and/or substrate temperature uniformity during processing. Generally, the greater the area of contact, the greater the heat transferred by conduction. Also, the geometry (e.g., diameter) of support pins 320 and materials properties (e.g., thermal conductivity) can affect the temperature and/or temperature uniformity of the substrate.

It is desirable to minimize the spacing between the bores (i.e., minimize the spacing between support pins) in order to maximize the total contact area of the support pins with the substrate. The total number of support pins 320 generally depends on the heat transfer system design. For processing of a 300 mm wafer, for example, the pin array preferably comprises at least 1000 support pins, more preferably at least 1500 support pins. In a preferred embodiment, the support pins are arranged in a dense array. The spacing between support pins is preferably less than about 5 mm, more preferably less than about 3 mm (e.g., about 2 or 1 mm).

The diameter ($d_P$) of each support pin 320 and the diameter ($d_B$) of each bore is preferably sized to permit each pin to move freely within the bore as indicated by arrow A (i.e., $d_P<d_B$), while minimizing the escape of pressurized gas from cavity 280 through the bores. Preferably, the diameter of each support pin is less than about 3 mm, preferably about 2 mm. Thus, it is desirable to minimize the gap between each support pin and its respective bore in order to minimize the escape of pressurized gas from cavity 280 via the bore. In a preferred embodiment, the support pin diameter is between about 0.1 and 5% less than the inner diameter of its corresponding bore. The outer diameter of the support pins and the inner diameter of the bores are preferably manufactured to within a tolerance of +/−5% of pre-selected values. Optionally, an O-ring seal (not shown) can be provided between support pin 320 and bore 265 in order to minimize the flow of pressured gas through the bores 265. Furthermore, the interior surface of bores 265 and/or the exterior surface of support pins 320 can be coated with a low friction, thermally conductive coating to facilitate motion of the pins while minimizing escape of gas from the cavity.

Figure 3:
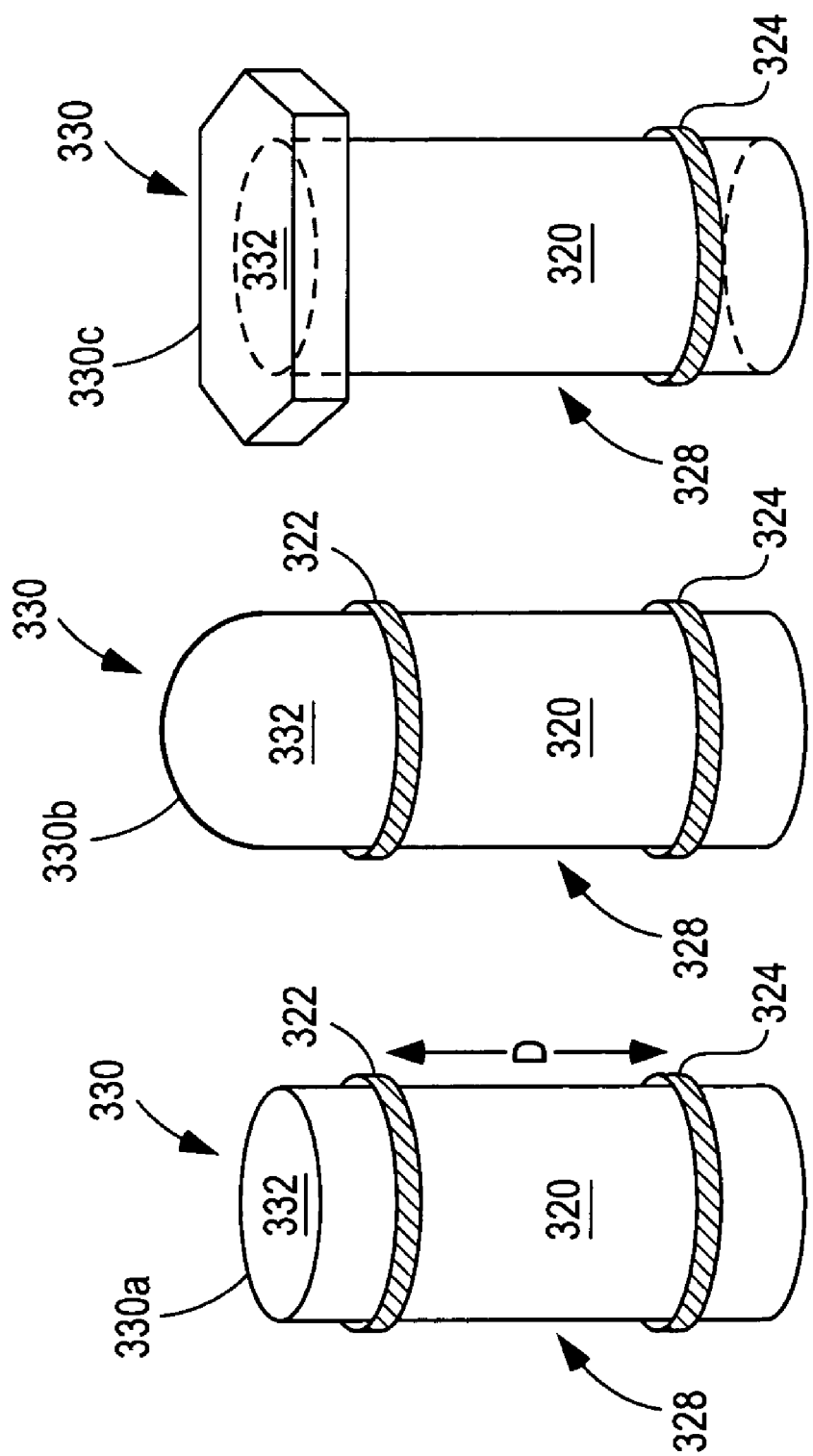
FIG. 3 shows exemplary support pin geometries.

Preferred configurations of each of the support pins 320 will now be described with specific reference to FIG. 3. Each support pin 320 comprises at its upper distal end a contact tip 330 adapted to make contact with the backside of a substrate. Each support pin can comprise a contact tip of varying geometries. For example, support pin 320 can comprise a substantially flat contact tip 330a or a hemispherical contact tip 330b. Furthermore, support pins 320 can comprise a contact tip that is shaped to maximize contact with the backside of a substrate. The body of each support pin is preferably cylindrical in shape. Thus, the cross section of each support pin is preferably circular, corresponding to circular bores 265. However, the upper distal end of one or more support pins can comprise a contact tip having a non-circular cross-section. For example, the tip can be enlarged to provide greater contact with the substrate. FIG. 3 shows a support pin 320 having a circular main body 328 adapted to slideably fit within bore 265 and a hexagonal contact tip 330c. Contact tip 330 comprises a contact surface 332 that can be substantially flat or curved. As discussed below, the roughness of the contact surface can be varied.

In a preferred embodiment each support pin is slideably retained with its respective bore. For example, as shown in FIG. 2, each support pin can be restricted in its range of motion by a pair of stops 322, 324. Upper stop 322 is provided to restrict the motion of each pin 320 in the downward direction by abutting upper surface 261, and lower stop 324 is provided to restrict the motion of each pin 320 in the upward direction by abutting lower surface 262. The distance along each pin between upper stop 322 and lower stop 324 is D. Preferably, the total range of motion of each pin 320 is less than about 5 mm (corresponding to the difference between D and t, where t is the thickness of upper wall 260). Still referring to FIG. 2, in an alternate embodiment, upper stop 322 can be omitted, lower stop 324 can be provided to restrict the motion of each pin 320 in the upward direction by abutting upper surface 262, and a lower distal end surface 326 of each pin 320 can restrict the motion of each pin in the downward direction by abutting upper surface 271. Furthermore, upper stop 322 can correspond to a contact tip 330 having a cross section larger than the diameter of bore 265. Upper and lower stops can comprise either a continuous or discontinuous protrusion that extends from the main body of the support pin in an amount sufficient to restrict the vertical motion of the support pin in either the downward or upward direction.

Each pin is configured to move independently in a direction substantially perpendicular to the backside surface of the substrate. In a preferred embodiment, using a preset gas pressure in the cavity, when a substrate is positioned on the uniformity pedestal, motion of the pins in the downward vertical direction will be caused by the weight of the substrate. Each of the pins that contacts the substrate will be displaced in a downward direction in an amount according to the relative height of the substrate surface at the point of contact. In other words, the depth of the pins within their respective bores, and hence their displacement from their fully extended positions, depends on the surface contours of the substrate. However, an upward force exerted on the pins by the pressured gas in cavity 280 can oppose the downward force due to the weight of the substrate. Preferably, during processing of a substrate, sufficient gas pressure is applied to cavity 280 to maintain each pin in the array in contact (e.g., thermal contact) with the backside surface of the substrate.

The motion of the support pins can be affected by increasing or decreasing the pressure of gas in cavity 280. By increasing the pressure of gas in the cavity, the pins can be forced upward until their upward range of motion is restricted (e.g., lower stops 324 engage lower surface 262). A pin is in its extended position when lower stop 324 engages lower surface 262. By decreasing the pressure of gas in the cavity, the pins can move downwardly (under the force of gravity acting on their own mass and/or due to the downward force caused by the mass of a substrate placed thereon) until their downward range of motion is restricted (e.g., upper stop 322 engages upper surface 261 or the lower distal end surface engages upper surface 271). When the downward range of motion of a pin is restricted the pin is in its retracted position. Preferably, prior to loading a wafer onto the uniformity pedestal the gas pressure in cavity 280 is increased in an amount effective to raise each pin 320 in the array. 300 to its extended position. However, when a wafer is loaded onto the uniformity pedestal the support pins in the array can be in their recessed position. It will be appreciated that, after a wafer is loaded onto the uniformity pedestal, gas pressure in cavity 280 can remain set or be increased or decreased in an amount effective to engage at least a majority of the support pin contact surfaces with the wafer.

The position of the support pins can be monitored during processing using one or more sensors. An output reading from a position sensor can be used to control the gas pressure in the cavity. For example, the gas pressure in the cavity can be reduced if position sensors indicate that support pins are in their extended position after placing a substrate on the support pins. Likewise, the gas pressure in the cavity can be increased if position sensors indicate that support pins are in their retracted position after placing a substrate on the support pins.

The mass flow pressure controller is set with the desired pressure value (the set point pressure) for the pressurized gas in cavity 280. The set point pressure is determined based principally on the mass of the substrate. In a preferred embodiment, a substrate to be processed is supported on pin array 300 and the mass flow controller increases or decreases the flow of the pressurized gas into cavity 280 in order to maintain support pins 320 between their extended and retracted positions. During processing, the mass flow controller can maintain the gas pressure in the cavity at a preset value or can adjust the value of the gas pressure in the cavity based on input from position sensors, if provided. During processing of a substrate the gas pressure in cavity 280 is preferably maintained at a level sufficient to force a majority of pins 320 in pin array 300 upward such that a contact surface 332 engages the backside surface of the substrate. Preferably, each pin 320 in pin array 300 will move vertically to a contact position such that the contact surface of the support pin is in contact (e.g., thermal contact) with the substrate. Thus, the uniformity pedestal provides a conformal support surface that comprises an array of support pin contact surfaces. During processing of a substrate, each contact surface can independently make thermal contact with the backside of the substrate.

During processing of a substrate, the substrate may become heated. The heat may be derived from, for example, plasma etching of the substrate. Heat from chemical reactions, sputtering of material, ion impingement, etc. is preferably conducted through the substrate, across the substrate/support pin interface, through the array of support pins, through pin base and finally to the heat transfer member. The heat transfer member is adapted to remove heat from the substrate via heat conductance through the uniformity pedestal. In an alternate embodiment the heat transfer member can supply heat to the substrate via heat conductance through the uniformity pedestal.

The thermal conductivity across the substrate/pin array interface can be increased by increasing the total contact area between the substrate and the pin array and/or by minimizing the roughness of the contact surface. In one embodiment, providing a dense array of support pins can increase the total contact area between the substrate and the pin array.

Various support pin array patterns are described. However, the array patterns described are only representative of the pattern that may be used to construct a conformal support surface. In a preferred embodiment, the support pin array comprises a dense array of identical pins. In a further embodiment, a contact tip of one or more support pins can be configured to maximize the thermal contact between the substrate and the substrate support pin. For example, the thermal contact can be maximized by controlling the shape and/or roughness of the contact tip. The pin array can comprise discrete zones wherein the arrangement of support pins in each zone can be constant or variable (i.e., the support pin material, pin dimensions, spacing between pins, and/or contact surface roughness, etc. can be constant or variable throughout the entire support pin array or throughout a zone within the array).

The efficiency of thermal contact between the substrate and the substrate support pins can be increased by decreasing the surface roughness of the support pin contact surface. Preferably the surface roughness of the contact surface of each support pin is less than the surface roughness of the backside of the substrate to which it makes contact. It will be appreciated, however, that the surface roughness can be provided to obtain the desired thermal contact between the substrate and the support pin. The surface roughness of an unpolished silicon wafer (corresponding to the backside surface) is typically about 0.3 microns.

The pin placement geometry as well as the roughness of the contact surface may be constant or may be intentionally varied across the pin array. For example, it may be desirable to provide support pins at the central portion of the array that have a contact surface roughness that is decreased and/or graded in comparison with support pins at the outer, annular portion of the array. In such a case, the reduced roughness can provide more efficient heat transfer at the central portion of the substrate.

The pin array 300 can be configured such that the outer periphery of the pin array is substantially co-extensive with the outer periphery of the substrate. Alternatively, the pin array 300 can be configured such that the outer periphery of the pin array is smaller than the outer periphery of the substrate. Thus, the substrate can have an overhang region at an outer edge thereof. Preferably, the pin array is fully covered by the substrate when the substrate is disposed on the uniformity pedestal for processing. For example, the outer edge of the pin array can terminate at a point that is about 2 mm inside the outer edge of the substrate. Alternatively, the outer periphery of the pin array may be configured to extend to the outer periphery of the substrate or extend beyond the outer periphery of the substrate.

The pin base is preferably mounted on a bottom RF electrode 400, which in turn is mounted on heat transfer member 500. Preferably the bottom RF electrode is a second plate. A layer of polymer adhesive such as silicone adhesive can be used to bond the pin base with the underlying electrode and/or bond the electrode with the underlying heat transfer member. The pin base can also be attached to the bottom electrode (and/or the bottom electrode can be attached to the heat transfer member) using other joining techniques such as soldering or brazing. Preferably, when a bottom RF electrode is provided, good thermal contact is made across each of the pin base-electrode and electrode-heat transfer member interfaces. When a bottom RF electrode is not provided, preferably good thermal contact is made across the pin base-heat transfer member interface. Thus, in either embodiment, the heat transfer system provides efficient and uniform thermal transfer between the substrate and the heat transfer member.

Figure 4:
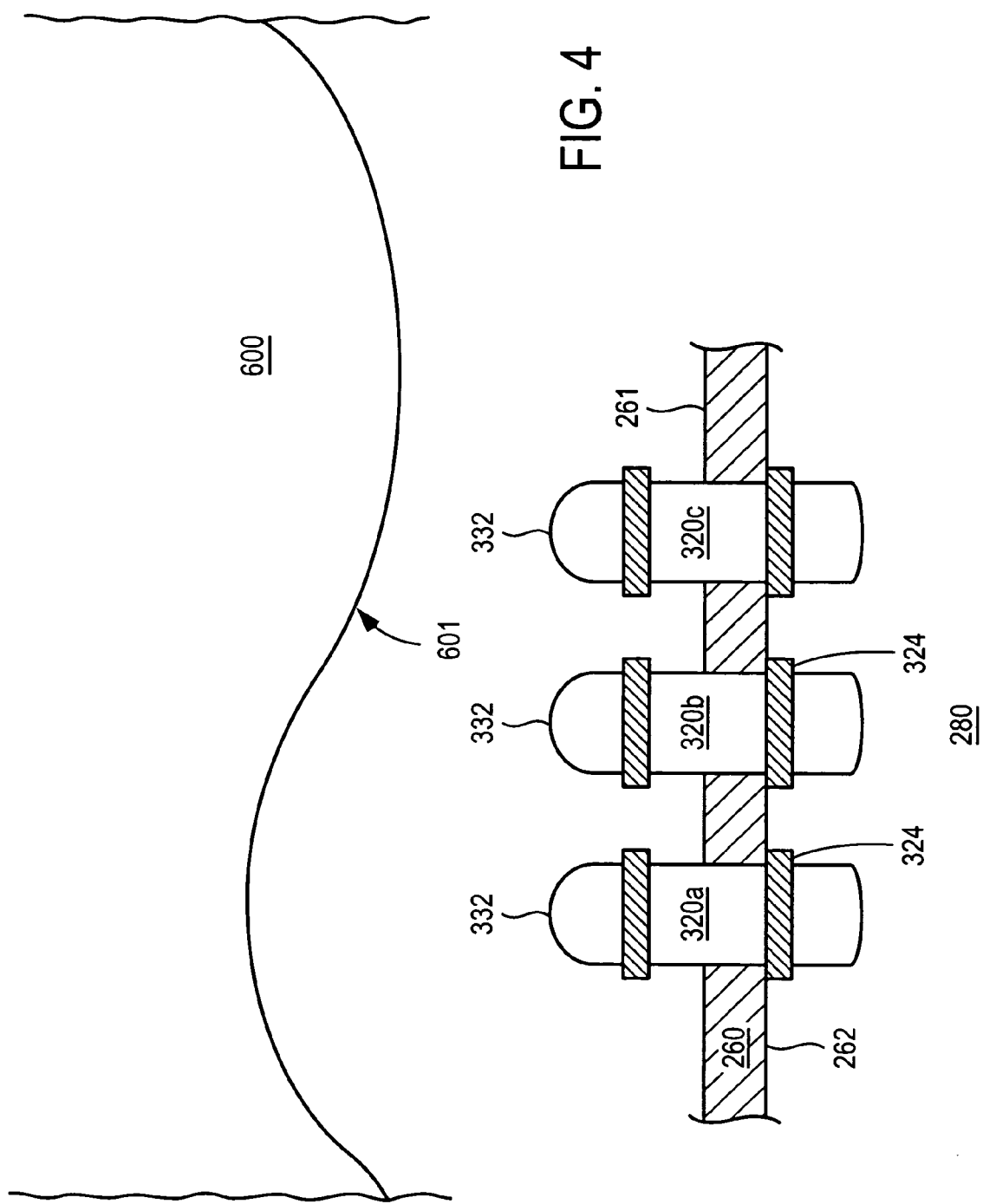
FIG. 4 is an exploded view of a segment of a heat transfer system prior to supporting a substrate thereon.

Illustrated in FIG. 4 is an exploded view of a partial cross section of uniformity pedestal 230. Support pins 320 (320a, 320b, 320c) are shown with lower stops 324 engaged with lower surface 262. Substrate 600 having a non-planar backside surface 601 is shown not yet supported by the uniformity pedestal.

Figure 5:
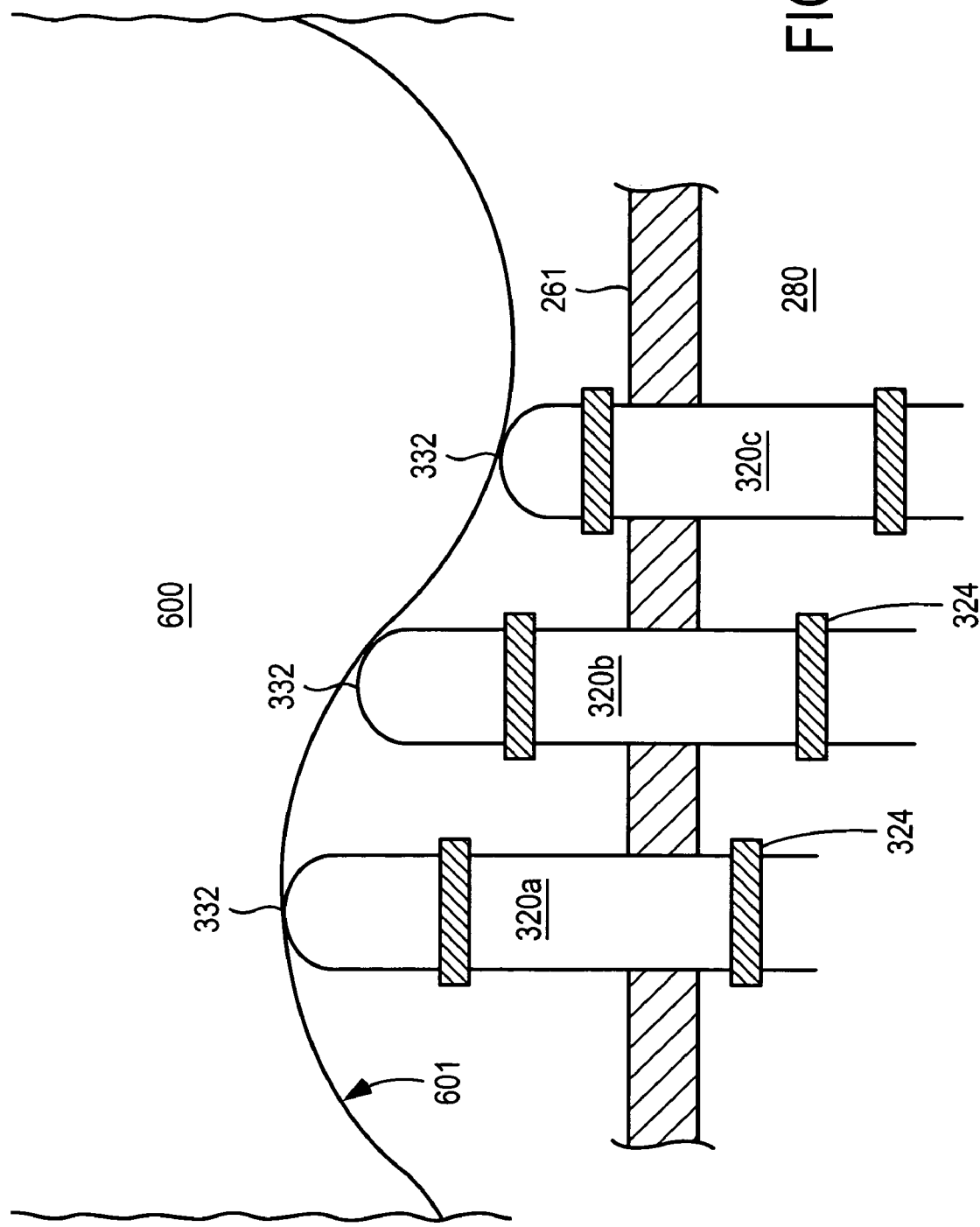
FIG. 5 is an exploded view of a segment of a heat transfer system after supporting a substrate having a non-planar backside surface thereon.

Illustrated in FIG. 5 is an exploded view of a partial cross section of the uniformity pedestal of FIG. 4. A portion of substrate 600 is shown supported on support pins 320. In operation, gas pressure in cavity 280 supplies an upward force to each support pin 320 sufficient to cause contact surface 332 of each support pin 320a–320c to make contact (e.g., thermal contact) with wafer backside surface 601. Referring specifically to FIG. 5, a first support pin 320a contacts a substantially recessed point on the backside surface of the substrate and is therefore displaced minimally from its fully extended position. Second and third support pins 320b, 320c each contact the substrate at points having various elevations and therefore have varying displacements based thereon. Thus, provided is a conformal substrate support surface that efficiently couples thermal energy between the substrate and the heat transfer member.

The heat transfer system can also be adapted to provide for lift-pins such as pneumatic or cable-driven lift pins, which can be used to load and unload the substrate from the uniformity pedestal. Generally, lift-pin holes extend from top surface 261, through upper wall 260, cavity 280, lower wall 270, electrode 400 and heat transfer member 500. The electrode 400 can comprise apertures that align with lift-pin holes but, preferably, are larger in diameter, thereby preventing the lift-pins from contacting the electrode. Preferably, the lift-pins are located in isolated passages that are not in fluid communication with cavity 280 in order to prevent the pressurized gas in the cavity from escaping through the lift-pin holes. In FIG. 2, a single lift pin 290 is shown movably positioned in passage 292.

The heat transfer member can include lift-pins such as cable actuated lift-pins mounted thereon, the lift-pins being movable towards and away from the uniformity pedestal such that the lift-pins travel through holes in the electrode and pin base to raise and lower a substrate onto and off of the uniformity pedestal. A cable-actuated drive assembly for moving a substrate in a vacuum chamber is disclosed in commonly-owned U.S. Pat. No. 5,796,066, the disclosure of which is hereby incorporated by reference in its entirety. The number of lift-pin holes generally depends on the heat transfer system design and/or the size of the substrate.

In some plasma reactors (e.g., high powered reactors) the surfaces next to the substrate (e.g., upper surface 261 of pin base 250 and/or support pins 320) may be exposed to a plasma region within the plasma processing chamber and hence consumed due to wear from the plasma, i.e., ion bombardment. Preferably, pin base 250 and/or support pins 320 are made out of a material that is resistant to the plasma environment. Alternatively, pin base 250 and/or support pins 320 can be coated with a material that is resistant to the plasma environment. Pin base 250 and/or support pins 320 are preferably made out of a material that allows RF energy supplied by an optional lower RF electrode to couple to a plasma generated above the substrate.

Preferably the pin base 250 is made from an electrically conductive, thermally conductive, RF transparent, plasma resistant material. Examples of suitable materials for the pin base include conductive materials (e.g., metals) and semiconducting materials (e.g., silicon, silicon carbide, diamond, diamond-like carbon, graphite, etc.). Preferably the support pins 320 are made from an electrically conductive, thermally conductive, etch resistant material. Examples of suitable materials for the support pins include conductive materials (e.g., metals), semiconducting materials (e.g., silicon, silicon carbide, diamond, diamond-like carbon, graphite, etc.).

In embodiments where the heat transfer member is adapted to cool the substrate, the electrode 400 can be insulated from the chamber environment and/or the surrounding materials and surfaces. The use of one or more electrode-insulating layers in a substrate support adapted to cool a substrate is disclosed in common-owned U.S. Pat. No. 6,337,277, the content of which is incorporated herein by reference in its entirety.

The uniformity pedestal is preferably arranged to be substantially cylindrical in shape and axially aligned with the process chamber such that the process chamber and the uniformity pedestal are cylindrically symmetric. However, it should be noted that this is not a limitation and that the pedestal placement may vary according to the specific design of each plasma processing system.

Although the uniformity pedestal has been shown and described as producing a uniform substrate temperature, it will be appreciated that the uniformity pedestal may also be configured to produce a non-uniform substrate temperature (e.g., to compensate for other processing non-uniformities such as a non-uniform plasma density).

Figure 6:
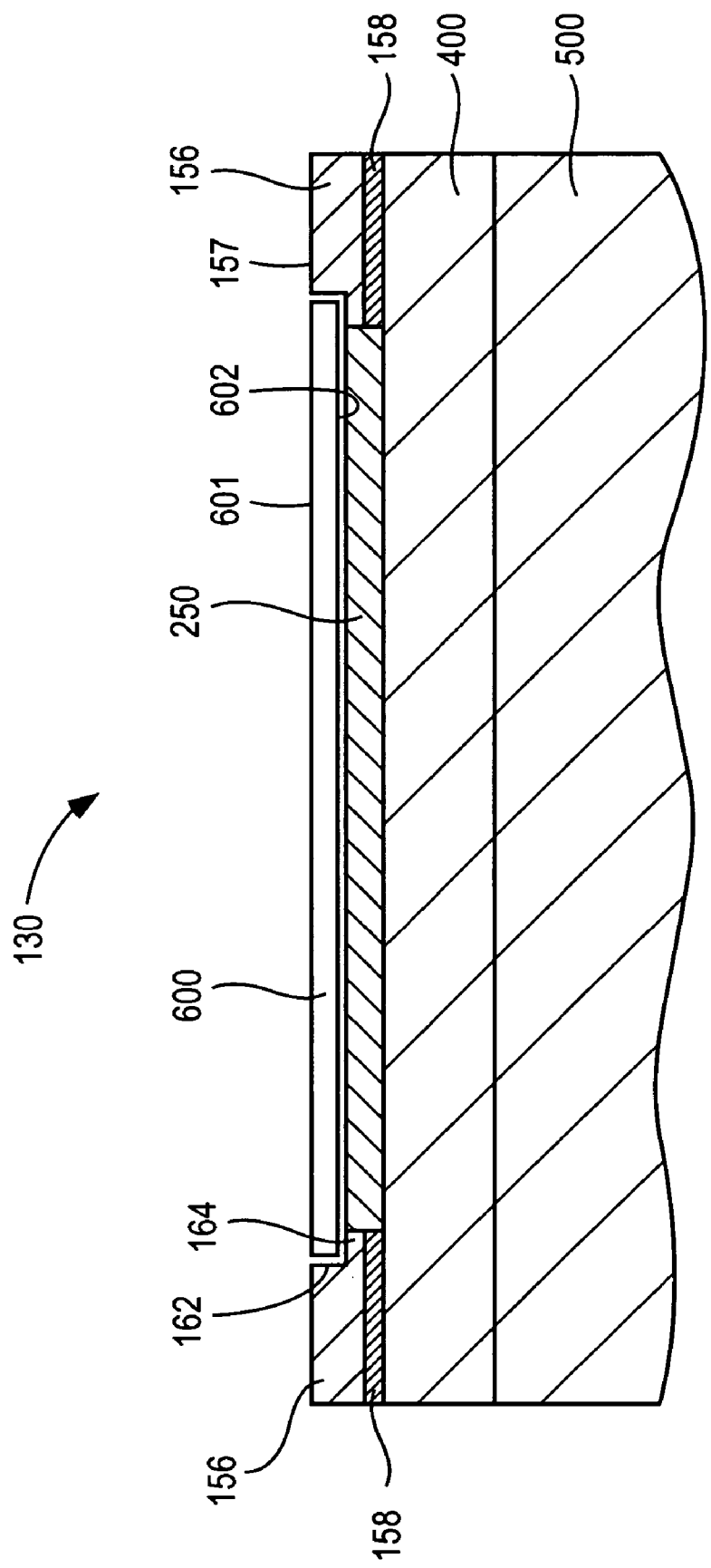
FIG. 6 is a side elevation view, in cross section, of a heat transfer system, in accordance with one embodiment.

In addition to the thermal coupling, the uniformity pedestal can be configured to produce a uniform electric field. Referring to FIG. 6, an edge ring 156 can be provided to improve the electrical and mechanical properties of the process near the edge of the substrate, as well as to shield the pin base and support pins from the reactants (i.e., ion bombardment). As such, the edge ring 156 is arranged to surround the edge of the substrate 600 and is disposed above the electrode 400 and around the pin base 250. In most cases, the edge ring 156 is configured to be a consumable part that is replaced after excessive wear. The edge ring 156 may be formed from a suitable dielectric material such as silicon, silicon oxide, silicon nitride, silicon carbide, quartz and the like. By way of example, an edge ring formed from silicon, and more particularly from single crystal silicon (e.g., doped silicon carbide), can be provided.

In order to effectively shield the pins 320, the edge ring 156 typically has a first portion 162 that surrounds the outer edge of the substrate 600 and a second portion 164 that surrounds the outer edge of the pin base 250. The second portion 164 is typically adjacent to the outer edge of the pin base 250 and disposed between the electrode 400 (if provided) and the substrate 600. As shown, the second portion 164 is covered by the substrate 160 when the substrate 160 is disposed on the uniformity pedestal 230 for processing. In one embodiment, the second portion of the edge ring extends about 2 mm under the substrate.

Further, the outer edge of the edge ring 156 can be configured to extend to at least to the outer edge of the electrode 400. In general, however, it is preferable to keep the width (measured across the bottom surface) of the edge ring 156 small to reduce the power needed to process the substrate 600. By way of example, a width of between about 2 to 15 mm can be provided. The edge ring advantageously provides a coupled region that extends beyond the edge of the substrate and therefore the electrical characteristics across the substrate tend to be more uniform. Further still, a top surface of the edge ring 156 (e.g., first portion 162) is arranged to be slightly below or about the same level as the top surface of the substrate such that the pin base and the edge ring cooperate to form a recessed portion for accepting the substrate for processing. However, it should be noted that the level of the top surface of the edge ring may vary according to the specific design of each plasma processing system (e.g., may extend above the substrate or may be sloped).

The edge ring 156 may be electrically floating or be electrically coupled to a DC ground (i.e., need not be an RF ground). Details of edge rings suitable for use with the uniformity pedestal to improve etch rate uniformity are disclosed in commonly-owned U.S. Pat. Nos. 6,039,836 and 6,344,105, the contents of which are hereby incorporated by reference in their entirety.

During processing, edge ring 156 can also serve as a retaining ring, which maintains the substrate properly aligned with the heat transfer system. For example, edge ring 156 can be provided such that upper surface 157 of the edge ring is higher than lower surface 601 of substrate 600. Thus, when substrate 600 is placed on the pin array, an outer periphery of the substrate can engage an inner periphery of the edge ring. Preferably, the edge ring cooperates with the array of substrate support pins to provide a substrate support surface that is recessed with respect to upper surface 157 of the edge ring. In a preferred embodiment, the upper surface 157 of the edge ring and the upper surface 601 of the substrate are substantially co-planar when the substrate is supported by the heat transfer system for processing.

The uniformity pedestal 230 can also include an impedance matching layer 158 that is disposed between the edge ring 156 and the electrode 400. The impedance matching layer 158 is preferably configured for controlling the impedance of the electric field produced by the electrode 400 across the surface of the substrate. More particularly, the impedance matching layer 158 is configured for altering the impedance of the electric field produced near the edge of the substrate 600. By altering the impedance, a more uniform coupling of energy is produced across the surface of the substrate. As a result, process uniformity may be obtained such that the process rate at the center of the substrate is substantially equal to the process rate at the edge of the substrate. Accordingly, the edge of the substrate may be used to form IC's thereby increasing the yield.

As shown in FIG. 6, the impedance matching layer 158 is sandwiched between the edge ring 156 and the electrode 400. The impedance matching layer 158 can be coupled to the upper surface of the electrode 400 or coupled to the lower surface of the edge ring 156. Preferably, the impedance matching layer is bonded on the corresponding surface (e.g., edge ring or electrode) to produce better thermal and electrical bonds. By way of example, a bonding process such as silicone elastomer, soldering or brazing can be provided.

Furthermore, for effectively controlling the impedance between the electrode and the plasma, the thickness of the impedance matching layer may be between about 0.10 to about 10 mm, and the impedance matching layer may be formed from a suitable material such as a dielectric, semiconductive or conductive material. By way of example, materials such as silicon, silicon oxides, silicon nitride, silicon carbide, quartz, aluminum, anodized aluminum and aluminum ceramics such as aluminum oxide can be used to form the impedance matching layer.

The width (e.g., amount of surface coverage) of the impedance matching layer is also a factor that can be used to control the impedance between the electrode and the plasma. For example, the width of the impedance matching layer can be equal to the width of the edge ring (e.g., across the bottom surface of the edge ring). Alternatively, the width of the impedance matching layer can be less than the width of the edge ring. Where the width of the impedance matching layer is less than the width of the edge ring, the smaller impedance matching layer may be positioned towards the inner periphery of the edge ring, the outer periphery of the edge ring or in the middle of the edge ring. By way of example, the impedance matching layer may be arranged so that it is disposed between the edge ring and the electrode only in the region of the substrate. Details of an impedance matching layer suitable for use with the uniformity pedestal to improve etch rate uniformity are disclosed in commonly-owned U.S. Pat. No. 6,363,882 the contents of which is hereby incorporated by reference in its entirety.

The degree to which the coupling of energy can be achieved is typically a factor of the overall impedance per unit area between the plasma and the electrode. Impedance is generally defined as a measure of the opposition to the flow of charge or current through a circuit. On a substrate having high and low impedance areas across the substrate and for a given power across the substrate, it is generally believed that in a low impedance region of the substrate, the coupled energy tends to be high and in a high impedance region of the substrate, the coupled energy tends to be low. Accordingly, the uniform coupling of energy is highly dependent on the impedance of the uniformity pedestal.

The overall impedance per unit area is a function of the impedance per unit area of the substrate, the impedance per unit area of the pin array, the impedance per unit area of the edge ring, the impedance per unit area of the impedance matching layer, and the impedance per unit area of any gaps or interfaces found therebetween. Typically, the impedance produced through the uniformity pedestal and the substrate at the center of the substrate is different than the impedance produced through the uniformity pedestal, the edge ring and the substrate at the edge of the substrate because of the materials property differences between the pins and the edge ring. As a result, the coupling of energy at the edge of the substrate is generally different than the coupling of energy at the center of the substrate (e.g., non-uniform).

The impedance matching layer can be arranged to adjust the impedance (e.g., sheath voltage) at the edge of the substrate such that the impedance at the edge of the substrate is equal to the impedance at the center of the substrate. In this manner, the coupling of energy across the surface of the substrate is more uniform, and therefore process uniformity can be achieved.

The thickness of the edge ring and the thickness of the impedance matching layer can be optimized to achieve the desired coupling effect. For example, a decrease/increase in the edge ring thickness and an increase/decrease in the impedance matching layer thickness may reduce/increase the impedance at the edge of the substrate. Furthermore, the materials properties (e.g., dielectric constant) of the impedance matching layer may be adjusted to match the impedance at the edge of the substrate with the impedance at the center of the substrate. For example, a decrease/increase in the value of the dielectric constant may reduce/increase the impedance at the edge of the substrate. The length and position of the impedance matching layer may be optimized to achieve the desire coupling effect. For example, a smaller/larger impedance matching layer length may reduce/increase the impedance at the edge of the substrate. Additionally, the position of the impedance matching layer with respect to an edge of the edge ring may also reduce/increase the impedance at the edge of the substrate.

Accordingly, the thickness of the impedance matching layer as well as the thickness of the edge ring, the materials properties of the impedance matching layer, and the length and the position of the impedance matching layer can be used to match the impedance at the edge of the substrate with the impedance at the center of the substrate.

Although the uniformity pedestal has been shown and described as producing a uniform electric field, it will be appreciated that the uniformity pedestal may also be configured to produce a non-uniform electric field to compensate for other processing non-uniformities such as a non-uniform plasma density. As mentioned, the amount of the impedance generally affects the amount of coupled energy and the amount of coupled energy generally affects the density and energy of the plasma used to process the substrate. Accordingly, the process uniformity of the overall system may be improved by purposefully designing a uniformity pedestal that is capable of creating variations in the electric field produced by the electrodes. In one particular embodiment, the impedance matching layer is arranged to alter the impedance of the uniformity pedestal so as to provide variations in the electric field across the surface of the substrate.

It should also be recognized from the foregoing description that a constant energy flux from the plasma has been assumed and substantially uniform wafer surface temperature can be obtained using a heat transfer system comprising a uniformity pedestal in conjunction with a heat transfer member. The principles of operation of a conforming support surface can be extended to the case of non-uniform and/or asymmetrical plasma densities across the surface of a substrate. In such a case, the support pin distribution (e.g., nominal contact area fraction) and/or surface roughness of the contact surfaces may be adjusted to match the expected plasma density profile at various locations on the substrate.

According to a preferred embodiment, provided is a method of processing a substrate using the heat transfer system described above. The method can include supplying a substrate to a process chamber having a heat transfer system incorporated therein, supporting the substrate on the uniformity pedestal of the heat transfer system and processing the substrate. The process can include supplying process gas to the chamber and energizing the process gas into a plasma and etching an exposed surface of the substrate with the plasma during the processing step. However, an exposed surface of the substrate can be coated during the processing step. The process gas can be energized into the plasma by any suitable technique such as supplying radio frequency energy to an antenna that inductively couples the radio frequency energy into the chamber. During the processing step, the substrate can be cooled by circulating a liquid coolant in the heat transfer member, which is in good thermal contact with the conformal support surface. Alternatively, the substrate can be heated by supplying a heated thermal fluid to the heat transfer member. Temperature changes in the substrate can be monitored with a temperature sensor supported by the pin base.

The process is applicable to etching of various dielectric layers such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molybdenum silicide, etc.

The heat transfer system is capable of processing substrates with a high degree of processing uniformity across the surface of the substrate. In particular, the uniformity pedestal provides a conformal substrate support surface that is capable of controlling the backside surface temperature of a substrate and therefore the front side surface temperature of a substrate supported thereon. Furthermore, the impedance of the uniformity pedestal can be controlled, and therefore the electric field that is coupled therethrough can be made uniform or non-uniform.

In one configuration, the support pins and impedance matching layer are arranged such that the uniformity pedestal produces a uniform temperature at the substrate surface and a uniform electric field inside the process chamber. As a result, the ion density and ion energy used to process the substrate is more uniform, and therefore uniform processing can be achieved.

In another configuration, one or both of the uniformity pedestal and the impedance matching layer are arranged such that the uniformity pedestal produces a variable temperature across the surface of the substrate and/or a varying electric field to compensate for other non-uniformities (e.g., non-uniform plasma density). As a result, processing uniformity can be improved upon. Additionally, the heat transfer system is configured for cooling (or heating) both the substrate and the edge ring during processing, which as a result reduces temperature, pressure and conductance fluctuations that tend to produce non-uniformities in processing. Accordingly, the heat transfer system reduces edge exclusion and increases substrate yield. The heat transfer system may be adapted to process a range of substrate sizes (e.g., 150 to 300 mm or larger).

In view of the foregoing, it is seen that the heat transfer system provides substantially improved temperature and/or electric field uniformity across the surface of a wafer supported by the uniformity pedestal without the use of an electrostatic clamping element.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A heat transfer system adapted to support a substrate for semiconductor processing of an upper surface thereof comprising:
    a pin base overlying and in thermal contact with a heat transfer member, said pin base having an upper wall, a lower wall and a side wall extending between the upper and lower walls and defining a cavity therebetween, wherein said upper wall comprises an array of bores;
    an array of substrate support pins each of which is slideably positioned in a respective one of the bores, each substrate support pin in thermal contact with the pin base and comprising a contact tip at its upper distal end; and
    a pressurized gas source in fluid communication with said cavity and adapted to supply pressurized gas to said cavity in an amount sufficient to move each support pin in an upward direction.

2. The heat transfer system of claim 1, wherein the pin array comprises a dense array of support pins.

3. The heat transfer system of claim 1, wherein the support pins are located no more than about 5 mm apart and/or the diameter of the support pins is between about 0.5 mm and 3 mm.

4. The heat transfer system of claim 1, wherein each of the support pins comprises a cylindrical pin body adapted to slideably move within a respective one of said bores, the cylindrical pin body having a substantially constant outer diameter, each of the bores having a substantially constant inner diameter, wherein the outer diameter of the cylindrical pin body is between about 0.1 and 5% less than the inner diameter of the bore in which the cylindrical pin body is located.

5. The heat transfer system of claim 1, wherein the support pins comprise a metal or a semiconductor and/or the pin base comprises a metal or a semiconductor.

6. The heat transfer system of claim 1, wherein the support pins and/or the upper surface of the pin base are coated with an electrically conductive and/or sputter resistant metal or semiconductor.

7. The heat transfer system of claim 1, wherein the support pins and the pin base are adapted to transfer thermal energy from the substrate to the heat transfer member when the substrate is supported on the support pins.

8. The heat transfer system of claim 1, wherein the pin base is bonded to the heat transfer member via solder, braze or an adhesive.

9. The heat transfer system of claim 1, further comprising at least one temperature sensor adapted to measure a temperature at a backside surface of the substrate.

10. The heat transfer system of claim 1, wherein the support pins further comprise at least one stop adapted to restrict the upward or downward movement of the support pins.

11. The heat transfer system of claim 1, wherein each contact tip comprises a contact surface having an average surface roughness of less than about 0.3 microns.

12. The heat transfer system of claim 1, wherein each contact tip is substantially flat or substantially hemispherical.

13. The heat transfer system of claim 1, wherein each of the support pins is adapted to be displaced downward by contact with a backside surface of the substrate and each of the support pins is adapted to be displaced upward by a positive gas pressure in the cavity.

14. The heat transfer system of claim 1, wherein the total vertical range of motion of each support pin is less than about 5 mm.

15. The heat transfer system of claim 1, wherein the pin array comprises at least 1000 support pins.

16. The heat transfer system of claim 1, wherein the heat transfer member comprises flow channels in fluid communication with a thermal fluid source adapted to provide a thermal fluid to the flow channels, said thermal fluid selected from the group consisting of water, liquid helium, liquid nitrogen, ethylene glycol, propylene glycol, and mixtures thereof.

17. The heat transfer system of claim 1, further comprising a plurality of thermoelectric elements on top of the heat transfer member.

18. The heat transfer system of claim 17, wherein the thermoelectric elements are arranged in concentric circles.

19. The heat transfer system of claim 1, further comprising a gas supply inlet in said pin base for flowing a pressurized gas into said cavity and an optional gas outlet for releasing a pressured gas from said cavity, wherein the pressurized gas is selected from the group consisting of helium, nitrogen and argon.

20. The heat transfer system of claim 1, further comprising an RF electrode configured for generating a plasma adjacent the upper surface of the substrate, wherein a bottom surface of the pin base is bonded to an upper surface of the RF electrode and a bottom surface of the RF electrode is bonded to an upper surface of the heat transfer member, wherein the bonding comprises solder, braze or an adhesive.

21. The heat transfer system of claim 20, further comprising an edge ring disposed above the RF electrode, the edge ring being configured for shielding the RF electrode and the pin base from a plasma, the edge ring having a first portion configured to be disposed between the RF electrode and the substrate when the substrate is supported by the heat transfer system; and an impedance matching layer disposed between the RF electrode and the edge ring, the impedance matching layer being bonded to the RF electrode and/or to the edge ring, the impedance matching layer configured to control an impedance between the RF electrode and a plasma, said impedance between arranged to affect the electric field to improve processing uniformity across the upper surface of the substrate.

22. The heat transfer system of claim 20, wherein the substrate is a semiconductor wafer and the electrode has a diameter less than, greater than or equal to the diameter of the wafer, but not more than about 2 mm less than or more than about 2 mm greater than the diameter of the wafer.

23. A method of processing a substrate in a process chamber comprising the heat transfer system of claim 20, said method comprising steps of:

supporting the substrate on the support pins;

contacting a majority of the contact tips with a backside surface of the substrate by controlling the gas pressure in the cavity; and processing the substrate.

24. The method of claim 23, wherein the process chamber is a plasma etch chamber and the processing comprises generating a plasma adjacent the upper surface of the substrate and etching an exposed layer on the upper surface of the substrate with the plasma.

25. The method of claim 23, wherein the processing comprises forming a layer on the upper surface of the substrate.

26. The method of claim 23, wherein the gas pressure in the cavity is maintained at a level effective to maintain at least 95% of the contact tips in thermal contact with a backside surface of the substrate during processing.

27. The method of claim 23, comprising cooling the heat transfer member to a temperature of less than about 100K during processing by circulating a thermal fluid in the heat transfer member.

28. The method of claim 23, comprising cooling the substrate to a temperature of less than about 450K during processing by circulating a thermal fluid in the heat transfer member and/or by supplying currents to a plurality of thermoelectric modules to control the temperature of the substrate support pins.

29. The method of claim 23, comprising maintaining a temperature gradient of at least about 200K or at least about 300K between the heat transfer member and the substrate.

30. The method of claim 23, wherein the step of processing comprises chemical vapor deposition, plasma vapor deposition, physical vapor deposition, sputtering, ion implantation, plasma etching or resist stripping.

31. The method of claim 23, comprising supporting and processing the substrate without clamping the substrate.

32. The method of claim 23, wherein the process chamber comprises a dual frequency capacitively coupled plasma reactor including an upper showerhead electrode and a bottom electrode, RF energy being supplied at two different frequencies to either the bottom electrode or at different first and second frequencies to the showerhead electrode and bottom electrode.

33. A plasma processing system for processing a surface of a substrate, comprising:
- a vacuum processing chamber adapted to ignite and sustain a plasma for processing; and
  - the heat transfer system of claim 1 disposed within the processing chamber.

34. The heat transfer system of claim 1, wherein said substrate support pins are movable to different heights relative to each other.

35. A heat transfer system adapted to support a substrate for semiconductor processing of an upper surface thereof comprising:
- a pin base overlying and in thermal contact with a heat transfer member, said pin base having an upper wall, a lower wall and a side wall extending between the upper and lower walls and defining a cavity therebetween, wherein said upper wall comprises an array of bores;
- an array of substrate support pins each of which is slideably positioned in a respective one of the bores, each substrate support pin in thermal contact with the pin base and comprising a contact tip at its upper distal end; and
- a pressurized gas source in fluid communication with said cavity and adapted to supply pressurized gas to said cavity in an amount sufficient to move each support pin in an upward direction, wherein the heat transfer member comprises flow channels in fluid communication with a thermal fluid source adapted to provide a thermal fluid to the flow channels.

* * * * *